(12) United States Patent
Bravo et al.

(10) Patent No.: US 11,915,461 B2
(45) Date of Patent: Feb. 27, 2024

(54) TRAFFIC CLASSIFICATION ARRANGEMENT FOR DETECTION OF METAL TIRES TREAD

(71) Applicant: Tecnovia S.A., Buenos Aires (AR)

(72) Inventors: Jose Humberto Cancela Bravo, Bay Shore, NY (US); Francisco Raimondo, Buenos Aires (AR)

( * ) Notice: Subject to any disclaimer, the term of this patent is extended or adjusted under 35 U.S.C. 154(b) by 150 days.

(21) Appl. No.: 17/414,948

(22) PCT Filed: Nov. 1, 2020

(86) PCT No.: PCT/US2020/058455
§ 371 (c)(1),
(2) Date: Jun. 16, 2021

(87) PCT Pub. No.: WO2021/221716
PCT Pub. Date: Nov. 4, 2021

(65) Prior Publication Data
US 2022/0319313 A1    Oct. 6, 2022

(30) Foreign Application Priority Data
Apr. 30, 2020  (AR) .................. P200101229

(51) Int. Cl.
*G08G 1/042*  (2006.01)
*G01R 33/07*  (2006.01)
(Continued)

(52) U.S. Cl.
CPC ......... *G06V 10/147* (2022.01); *G01R 33/072* (2013.01); *G01R 33/077* (2013.01); *G08G 1/0133* (2013.01); *G08G 1/042* (2013.01)

(58) Field of Classification Search
None
See application file for complete search history.

(56) References Cited

U.S. PATENT DOCUMENTS

| | | | | |
|---|---|---|---|---|
| 3,346,842 A | * | 10/1967 | Dixon | G08G 1/042 340/940 |
| 4,038,633 A | * | 7/1977 | King | G08G 1/042 340/567 |

(Continued)

FOREIGN PATENT DOCUMENTS

| | | |
|---|---|---|
| CN | 201247212 Y | 5/2009 |
| EP | 1178457 B1 | 2/2010 |
| WO | 2008054542 A2 | 5/2008 |

OTHER PUBLICATIONS

International Search Report and Written Opinion received in Patent Cooperation Treaty Application No. PCT/US2020/058455, dated Feb. 4, 2021.

*Primary Examiner* — John F Mortell (57) ABSTRACT

A tire or tread detection device for the classification of vehicular traffic. The invention allows the detection of tires by identifying with certainty the number of axles that make up a vehicle, thus determining its traffic category or classification, for the determination of loads, toll collection and evaluation of traffic supply and demand. The invention is a development integrated by hardware and software, electronic control devices, signal analysis and communications. The device is made up of Hall Effect sensors for detecting the magnetic field and magnetic field reinforcement magnets, geometrically arranged and interconnected to a microcomputer that interprets analog signals, to obtain the detection of the tire.

22 Claims, 7 Drawing Sheets

(51) Int. Cl.
    *G06V 10/147*    (2022.01)
    *G08G 1/01*      (2006.01)

(56) References Cited

U.S. PATENT DOCUMENTS

| | | | | |
|---|---|---|---|---|
| 4,953,394 | A * | 9/1990 | Franke | B60C 23/0425 |
| | | | | 340/448 |
| 6,807,075 | B2 * | 10/2004 | Miermans | H02M 3/33507 |
| | | | | 323/901 |
| 6,867,709 | B1 * | 3/2005 | Povey | G08G 1/042 |
| | | | | 340/941 |
| 9,481,366 | B1 * | 11/2016 | Gordon | G05D 1/0088 |
| 2002/0021124 | A1 | 2/2002 | Schott et al. | |
| 2004/0027220 | A1 | 2/2004 | Gunther et al. | |
| 2006/0212193 | A1 | 9/2006 | Breed | |
| 2009/0079425 | A1 | 3/2009 | Huang | |
| 2010/0157612 | A1 | 6/2010 | Hirose et al. | |
| 2011/0292692 | A1 | 12/2011 | Gillmor | |
| 2012/0101746 | A1 | 4/2012 | Taylor et al. | |
| 2012/0185214 | A1 * | 7/2012 | Icove | G01V 3/081 |
| | | | | 340/657 |
| 2014/0240719 | A1 | 8/2014 | Koeppe | |
| 2014/0362535 | A1 | 12/2014 | Meier et al. | |
| 2016/0328961 | A1 | 11/2016 | Garces et al. | |
| 2018/0025630 | A1 * | 1/2018 | Matsumoto | G08G 1/065 |
| | | | | 340/909 |

* cited by examiner

TRAFFIC CLASSIFICATION ARRANGEMENT FOR DETECTION OF METAL TIRES TREAD

CROSS-REFERENCE TO RELATED APPLICATION

This application is a national phase application of Patent Cooperation Treaty Application No. PCT/US2020/058455 filed Nov. 1, 2020, which claims priority to Argentine Application No. P200101229 filed Apr. 30, 2020, which is incorporated herein by reference in their entirety.

FIELD OF THE INVENTION

The present invention relates to a vehicle classification arrangement for traffic statistics on routes, highways and for toll collection at stations and multi-lane free-flow systems.

BACKGROUND

U.S. Pat. No. 9,916,757 B2 describes lane sensors that are used to count the number of sets of wheels in vehicles passing over road sensors. Lane sensors can also be used to classify vehicles at single and multiple lane sites for tolling and/or traffic planning. For counting vehicles, the invention is designed for detection of sets of wheels with tires using inductive loop sensors for toll roads in single lane (conventional) applications. Sensors detect vehicle tire sets and vehicle trailers being towed to provide the sum of the axle sets. For characterization of the vehicle, the sensor arrangement uses a combination of sensors including Eddy current effect sensors and inductive loops such as ferromagnetic effect type sensors.

By combining these sensors, the characteristics of the vehicle, the direction of travel and its speed are detected. It can be used to detect non-radial wheels (lacking metallic mesh) since it reacts by the passage of each of the axles of the vehicles, but not by the metallic mesh passage of the radial wheels.

The aforementioned document presents a type of electromagnetic loop "Smart LoopTreadle" arranged in the form of arrangements on the pavement that allows identifying the position of the wheels of vehicles in a single lane or multiple lanes and also detecting if they are simple or dual at low and high speed.

The configuration of the system of the cited document depends on the geometry of the sawing on the pavement to which a coiled matrix with different turns and sizes is practiced. Likewise, the different windings configure the ferromagnetic and eddy current sensors, being able to detect vehicle formations with radial tires, with a metal tread and "biasply" with a Nylon band.

The adjustment of the system is completely dependent on the installation, the type of sawing matrix to be performed is applicable only to rigid pavement due to the size of the coils that must define the width of the wheel, as specified in the document.

There are two disclosures prior to the cited document, U.S. Pat. Nos. 5,614,894 and 6,483,443 B1, referred to in U.S. Pat. No. 9,916,757 B2, which use detection methods by loop arrangements with different configurations and sizes such as ferromagnetic sensors driven by oscillating magnetic fields and detecting wheel passage by varying the system oscillation frequency. U.S. Pat. No. 9,916,757 B2 uses the same operating principles as those previous inventions, i.e. oscillating magnetic field, for detecting wheels with metal mesh and adds loop arrangements for generating eddy currents whose frequency response against biasply wheels is different.

The present invention has the advantage that it does not require coils or loops on the pavement because its sensors are integrated in a single cabinet with sizes described in the figures, with its controller integrated in the same cabinet. Therefore, it does not invade a larger space than that described in these figures to carry out its function.

On the other hand, in FIGS. 2B, 2E and 2F of the cited document U.S. Pat. No. 9,916,757 B2, it is observed that the space necessary to carry out this function is much greater, being exposed to possible failures due to cracks in the paved area.

Furthermore, the present invention does not use variable frequencies for the ferromagnetic detection of radial steel mesh wheels, since it is based on constant magnetic fields, generated by neodymium magnets and Hall Effect sensors.

In the aforementioned document, the controller that performs the analysis of the signals for classification is subject or dependent on an installation involving great difficulty in its realization, depending on the pavement cuts and coils required.

By contrast, in the present invention the detection is carried out on the steel mesh of the radial type tires themselves and for this a "Hall effect" detector is used, in which the detection is caused by the variation of the magnetic field of a permanent magnet in the presence of the steel of the radial wheel. Therefore, the cited document does not affect the novelty of the present invention.

It is understood then that the principles used for detection between the cited document and the present invention are completely different and the same applies to the 2 previous inventions that share the same physical electric principles of magnetic field oscillation for the detection of steel or radial mesh wheels, with differences regarding the shapes and diagrams of the coils on the pavement.

The present invention innovates regarding the type of sensor used, type of constant magnetic field and form factor of the device. The present invention furthermore presents very good selectivity in the discrimination between single and dual wheels and independent of the vehicle's speed.

The present invention is not affected by the environment where it is installed, or by the iron content of the environment or of an iron mesh in the pavement, since it is completely immune to couplings and/or variations of materials present therein.

KR 100917051 B1 describes an automobile traffic information device and a performance method therefor to optimize traffic information on road design and traffic volume by accurately capturing information from automobiles and driving conditions of automobiles traveling at high speed. A device that provides traffic information comprises the first and second loop sensors (2,5), the first and second axle detection sensors (4,6), the first inclined line axle detection sensor (7), the second inclined line axle detection sensor (8) and a division of the computer system. The first and second loop sensors are successively arranged to be adjacent to the left and right wheels of the vehicles. The first and second axle detection sensors detect the vehicles based on the pressure of the vehicle wheels and emit the vehicle detection information. The first oblique line axle detection sensor detects the traveling path of vehicles. The division of the computer system produces the traffic information according to the traveling path of the tires.

However, the document does not mention or suggest the use of Hall Effect detectors or magnetic field reinforcing magnets to detect the passage of a radial tire wheel, therefore the cited document does not affect the novelty of the present invention.

U.S. Pat. No. 7,071,840 B2 describes a ferromagnetic circuit having a footprint formed by a continuous wire shaped in a serpentine manner to form multiple contiguous polygons within the footprint for detection of moving vehicles. The footprint can be one of a triangle, a square, a rectangle, a rhombus, a parallelogram, an ellipse, or a circle. Similarly, each of the multiple contiguous polygons can be one of a triangle, a square, a rectangle, a rhombus, a parallelogram. Different design configurations for the ferromagnetic loop and methods for making and using the same are disclosed.

However, this document neither mentions nor suggests the use of Hall effect detectors or magnetic field reinforcing magnets to detect the passage of a radial tire wheel, for which reason the aforementioned document does not affect the novelty of the present invention.

Document U.S. Pat. No. 6,670,891 B2 discloses a device formed by a magnetic detector of the passage of at least one wheel of the vehicle, whose sensor is intended to be placed on a road, and includes a conductive winding of at least one spiral and a ferrite structure engraved on an elongated surface area, the conductive element wound around a portion of the ferrite structure, parallel to its largest dimension.

Although the use of ferrite parts could resemble the use of reinforcing magnets, this document does not mention or suggest the use of Hall effect detectors to detect the passage of a radial tire wheel, for which reason the aforementioned document does not affect the novelty of the present invention.

Document FR 2830358 B3 describes a device comprising an axle detector (20, 50) placed perpendicularly below the barrier element (2) of the payment channel and an axle counter (30) to activate an alarm, when the number of axles exceeds a preset limit. In this way, an attempt is made to prevent two vehicles that cross the barrier in a totally contiguous way from paying a single toll ticket. The axle detector is based on a magnetic sensor (20) that detects the passage of the vehicle wheels together with an excitation and processing circuit (50). The invention also relates to a corresponding payment barrier for motor vehicles with tolls, etc.

However, this document neither mentions nor suggests the use of Hall Effect detectors or magnetic field reinforcing magnets to detect the passage of a radial tire wheel, therefore the cited document does not affect the novelty of the present invention.

JP 2003281688 A describes a new method of vehicle discrimination using a magnetic tire having a magnetic pattern that encodes the required information. The invention consists of a tire 1 having a magnetic pattern for providing it with a code and other vehicle discrimination information and wherein a magnetic sensor 6 and the tire 1 are relatively arranged in a direction of formation of the magnetic pattern. The vehicle discrimination information is decoded based on the magnetic quantity detected by the magnetic sensor, thus discriminating the vehicle, that is, it links the tire to the vehicle through a magnetic coding and thus identifies the vehicle.

However, this document does not describe a vehicle traffic classification in order to count the number of axles and determine its category, but particular vehicle identification through its tires. Furthermore, it neither mentions nor suggests the use of Hall effect detectors or magnetic field reinforcing magnets to detect the passage of a radial tire wheel, for which reason the aforementioned document does not affect the novelty of the present invention.

U.S. Pat. No. 6,611,210 B2 discloses a wire-loop vehicle detector is configured with a vertically oriented blade aligned at an angle to the direction of traffic-flow with each end of the blade extending laterally beyond the normal limits of vehicle presence over the blade. The extended blade configuration of the wire-loop causes over-passing vehicles to present repeatable inductive signatures while electromagnetic noise and thermal-drift are selectively canceled using a secondary coil to increase the signal-to-noise ratio of inductance measurements. Inductive signatures of vehicles are recorded using a high-speed and high-precision method of making multiple successive measurements of the inductance of a wire-loop as vehicles pass over. Inductive signatures of automotive vehicles are useful for parking-lot revenue control, car-bomb detection, passive security of isolated communities, and other traffic-flow monitoring and control applications.

However, this document neither mentions nor suggests the use of Hall effect detectors or magnetic field reinforcing magnets to detect the passage of a radial tire wheel, for which reason the aforementioned document does not affect the novelty of the present invention.

WO 03/028047 describes a surface-mounted inductive loop detector including: a pad containing an inductive loop that is adapted for connection to an external electronic controller device; said pad is fixed within a hardened beveled peripheral edge which is provided with means for fixing the pad to a surface. In a second aspect, the document discloses a surface-mounted inductive loop detector that includes: an inductive loop that is adapted for connection to an external electronic controller device; a protective cover in the form of a substantially inflexible ring having a hardened beveled peripheral edge; said ring adapted to accommodate the inductive loop between a mounting surface and a lower surface of the ring and provided with means for fixing the detector to the mounting surface.

However, this document neither mentions nor suggests the use of Hall effect detectors or magnetic field reinforcing magnets to detect the passage of a radial tire wheel, for which reason the aforementioned document does not affect the novelty of the present invention.

WO 00/58927 discloses a loop detection apparatus for detecting vehicles traveling along a lane of a roadway and comprising an outer loop that produces a region of magnetic field with the same polarity and an inner loop dimensioned for fit within this region of constant polarity. The inner loop provides two regions of opposite polarity, so that the field produced by the outer loop has no effect on the inner loop. Detection circuits activate the outer and inner loops individually to separately detect vehicles passing through the loops.

However, this document neither mentions nor suggests the use of Hall effect detectors or magnetic field reinforcing magnets to detect the passage of a radial tire wheel, for which reason the aforementioned document does not affect the novelty of the present invention.

WO 00/58926 describes an inductive loop sensor for detecting vehicles traveling in a lane of a roadway, comprising a figure-of-eight conducting loop. The loop is arranged with its three segments transversely across the roadway to detect the wheels of vehicles travelling along the roadway. The length of the loop in the direction of travel along the roadway is less than 60 cm. Traffic monitoring apparatus energizes the loops and detects the passage of vehicle wheels over the loops to provide for the classification of vehicles by axle count.

However, this document neither mentions nor suggests the use of Hall effect detectors or magnetic field reinforcing magnets to detect the passage of a radial tire wheel, for which reason the aforementioned document does not affect the novelty of the present invention.

WO 00/49590 describes a vehicle detector and classifier comprising a plurality of electrically conductive loops (1) arranged substantially in a plane perpendicular to a road surface, to detect the wheels of a vehicle. The loops can be arranged in a transverse, vertical slot (2) and housed in a flexible enclosure. An electronic circuit (3), including an oscillator, can be positioned adjacent each loop (1) in the slot (2) to energize and monitor the loop. The detector preferably also includes a conventional circuit arranged substantially in the plane of the road surface, for detecting vehicle bodies, and means for superposing the results obtained from the conventional and vertical circuits to aid in classifying detected vehicles.

In this case there is a similarity with the method of detecting the pitch of a steel mesh tire of the present invention because the cited document uses small aligned coils located in a small groove in the pavement and arranged perpendicular to the direction of traffic flow. However, the devices involved in detection are coils and are not permanent magnets or Hall Effect sensors integrated together with a computer in the same equipment, so the document does not affect the novelty of the present invention.

EP 0841647A1 discloses a method that involves measuring the magnetic characteristics of a vehicle passing (4) on it with various magnetic field sensors (2) arranged transversely across the road and in series at various successive positions. The sensor signals are digitized and combined to form a measurement value that is converted into a one-dimensional measurement value sequence (9a). The sequence of the measurement value is transformed into a characteristic vector (VM) using a transformation matrix, stored and compared with previously determined characteristic vectors. In a preferred embodiment, sufficiently sensitive magnetoresistive sensors are used that can measure the earth's magnetic field and determine changes in this field caused by the passage of a vehicle, thereby ensuring high precision in individual measurements so that the same vehicle models with identical equipment can be distinguished. The signals are analyzed in a computer and the detection parameters of each sensor are established and are stored in a matrix for subsequent analysis, from which patterns with similar characteristics are sought to identify different types of vehicles.

Although the document's method is based on a linear array of sensors, the document does not mention or suggest the use of Hall Effect detectors or magnetic field reinforcing magnets to detect the passage of a radial tire wheel, so the cited document does not affect the novelty of the present invention either.

JPH 08255297A describes a vehicle information control device that does not require a special device to be mounted on it. The invention is an information control device for a vehicle that is driven, parked, or stopped within a special traffic route, such as a toll road. At the entrance to the special traffic route, a magnetization element writes information on a part of a magnetic inner layer of a vehicle wheel, for example, a steel radial part, for example magnetic data in the circumferential direction of the wheel by following the rotation of the wheel. At the exit of the special traffic route, a reading part is arranged to read information that has been written on the part of the inner layer of the wheel following the rotation of the wheel.

However, this document is related to information recording in order to identify a vehicle and does not mention or suggest the use of Hall effect detectors or magnetic field reinforcing magnets to detect the passage of a radial tire wheel, for which reason the cited document does not affect the novelty of the present invention either.

WO 94/01847 a device for detecting one or more wheels of a vehicle or a device with movable wheels and a method of using said device. The device consists of at least one electromagnetic circuit and an evaluation unit and is characterized in that said electromagnetic circuit (2) has a small size (2) in the direction of movement of the vehicle or the axis of the road (X), which is smaller than the diameter of the wheels of the vehicle to be identified, and a rectangular shape and/or rectilinear configuration arranged at right angles to the axis (X) of the road (1). The loop is sensitive in a different and opposite way to the electromagnetic influences of the metallic masses of a vehicle that move in translation and to the rotating metallic masses of the wheels of said vehicle.

However, this document neither mentions nor suggests the use of Hall effect detectors or magnetic field reinforcing magnets to detect the passage of a radial tire wheel, for which reason the aforementioned document does not affect the novelty of the present invention.

PRESENT STATE OF THE ART

The detection of tires in general allows the number of axles that make up a vehicle to be identified, thus determining its traffic category or classification.

Vehicles in transit are characterized by national and international road authorities as formations according to the number of axles, type of axles (single or dual) and grouping (double and triple axles). These formations are classified into categories for the determination of loads, toll collection and evaluation of the traffic supply and demand. The classification of vehicles used in the measurements of traffic volume or toll collection depends directly on the number of axles (wheels), discriminated as single or dual.

There are different types of sensors for counting axles (wheels) on the international market: vulcanized rubber embedded contacts (switches), pneumatic tubes, piezoelectric contacts, fiber optic systems, electromagnetic loops and other non-intrusive laser-based Doppler radar technology devices.

These systems are generally used to:
Know the volume of traffic and determine traffic demand
Conventional toll collection.
Toll collection in "Free Flow" type free transit systems.
Traffic control in road arteries and traffic light control.
Access control to restricted areas.

A commonly used type of application sensor for determining traffic volume and speed is the electromagnetic loop known as the magnetic loop.

This sensor is a coil with appropriate sizes for the detection of the vehicle metal mass, which is installed embedded in the pavement and by means of an electronic controller connected to this coil, the variation of the inductance against the presence of a vehicle is measured.

Different topologies of electromagnetic loops can determine, speed, length, and thus discriminate between heavy transport vehicles (long) and automobiles, but without the ability to discriminate the number of wheels and, therefore, without the ability to determine the number of axes.

Figure 1:
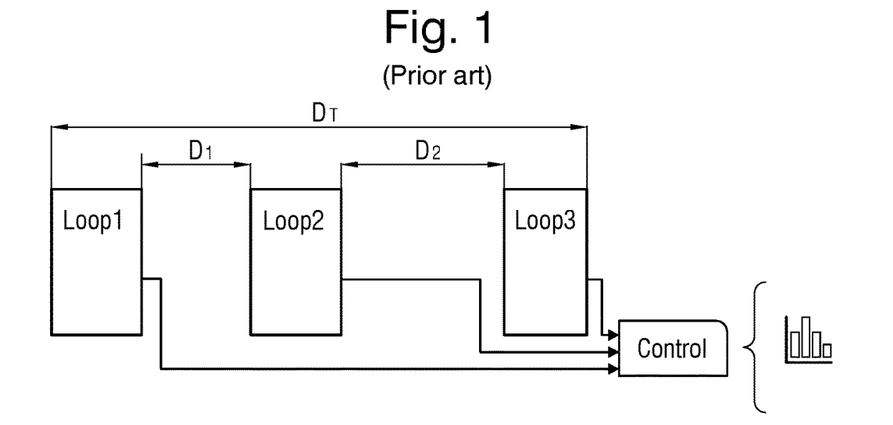
FIG. 1 shows a known device that is used in statistical control in the determination of speed and length.

FIG. 1 shows a known device that is used in statistical control in the determination of speed and length, by means of the known distances $D_1$ and $D_2$ and that together determine a total distance $D_T$, to determine volume of traffic with a low level of category discrimination, to distinguish only heavy and light vehicles. However, this system is not suitable for classifying by vehicle category according to current requirements at toll stations.

On the other hand, the electromagnetic loop, in its standard topology, as a rectangular, square or rhomboidal coil is also not capable of discriminating axles or the presence of wheels to classify the category of the vehicle type. Therefore, the electromagnetic loop is used only as a metal mass detector and is combined with mechanical, pneumatic, piezoelectric and fiber optic contact type sensors to be used as axle (wheel) counters and, in this way, being systematized together, they can classify categories of vehicles.

Figure 2:
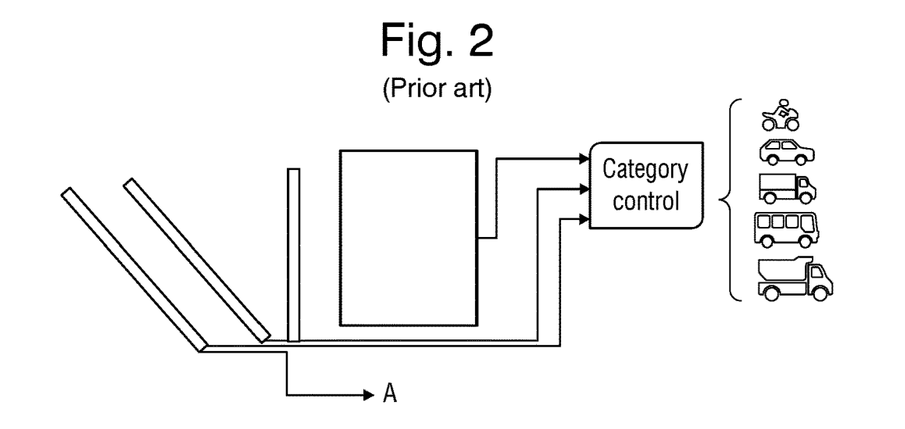
FIG. 2 shows another known device that is made up of contact (switch) and loop wheel sensors, classifies by number of axles, single and dual, and it does so at low speed.

FIG. 2 shows a known set that consists of wheel-loop sensors and classifies by number of axles, single and dual. In the figures it can be seen that the obliquely located wheel sensors A detect the wheel width, for the classification of dual wheels. Sensors A can be dry contact, pneumatic, fiber optic, piezoelectric, etc., sensors.

In all cases, to achieve a complete classification by type of wheels, single and dual, and by means of sensors; contacts (switches), pneumatic, piezoelectric and fiber optics, the sensors should be located with the arrangement indicated in FIG. 2. This type of configuration is useful to classify categories in toll lanes between 3.00 and 3.30 m channeled between curbs. However, these systems are not useful for multi-lane free flow measurements, because the traffic must be channeled within a lane and any deviation of the vehicle causes false readings. Therefore, such a system is not applicable to classify traffic categories in free flow measuring systems and/or "Free Flow" toll collection systems.

The axle sensors, contact (switch) and pneumatic type, work by means of pressure that exerts the passage of the wheels of the vehicle on them but they are only suitable for low-speed applications, due to impact wear that affects their useful life. In other words, the use of these sensors is limited to the classification of vehicle categories in low-speed systems, e.g., toll collection stations.

Those of the piezoelectric and fiber optic type, on the other hand, are for use at high and low speed, because the sensor receives the impact of the wheel through the deformation of other materials such as polyurethane resins in which sensor is embedded. The latter are used on highways to count single axles, to measure speed and to perform traffic statistics, but they do not fully classify and cannot record dual axles without having the configuration explained in FIG. 2. This same configuration, as previously mentioned, is not applicable in multilane systems.

Figure 3A:
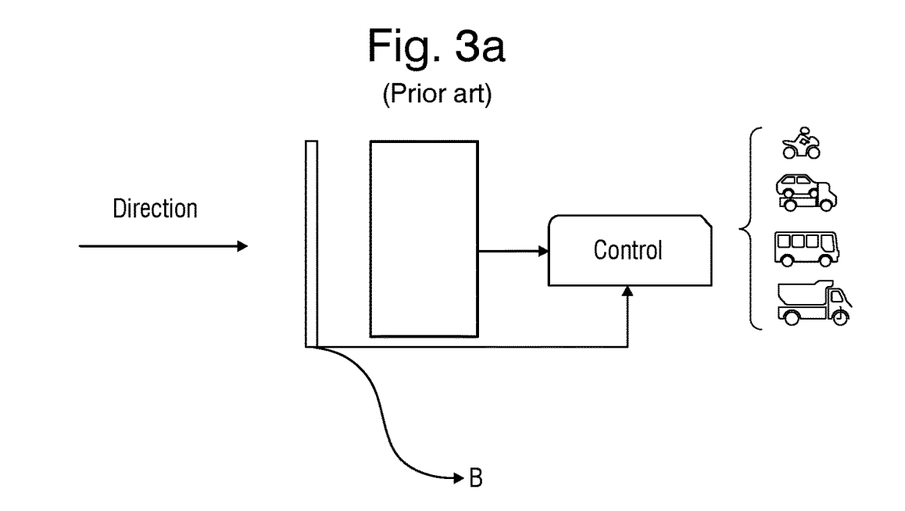
FIG. 3A presents an example of a known device designed for a low or high speed single lane.

FIG. 3A shows a known device that is a configuration designed for a low or high speed single lane, and that does not require oblique sensors for the detection of dual (wide) wheels. Therein, a single axle counter device B is seen which is arranged transversely to the direction of advance of the vehicles and which acts as a single and dual axle counter, for radial wheel or metal tread tires.

Figure 3B:
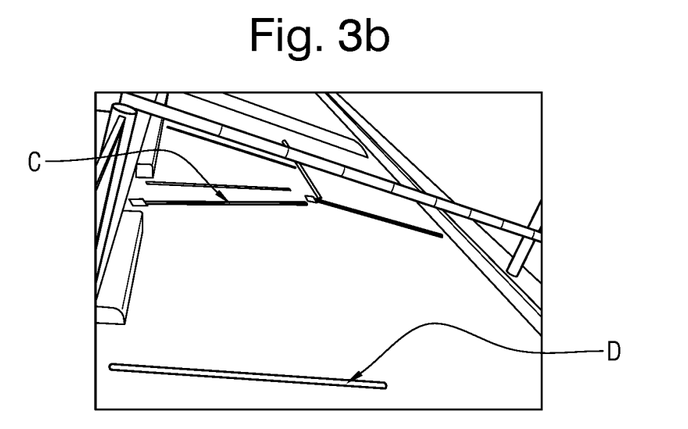
FIG. 3B shows a photograph of a known contact (switch) device and one according to the present invention to make comparative tests on a toll road.

FIG. 3B shows a photograph of an example of replacement of the known contact (switch) arrangement C that requires 3 axle counters for the radial wheel detection arrangement of the present invention D to carry out tests on a toll road.

Figure 3C:
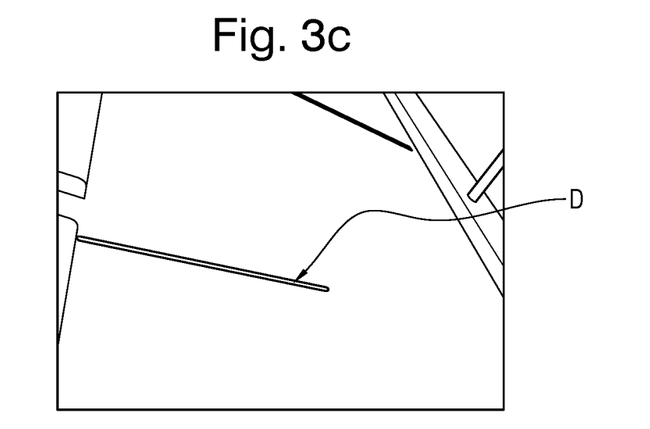
FIGS. 3C and 3D show photographs of the device of the present invention installed in a toll station.
Figure 3D:
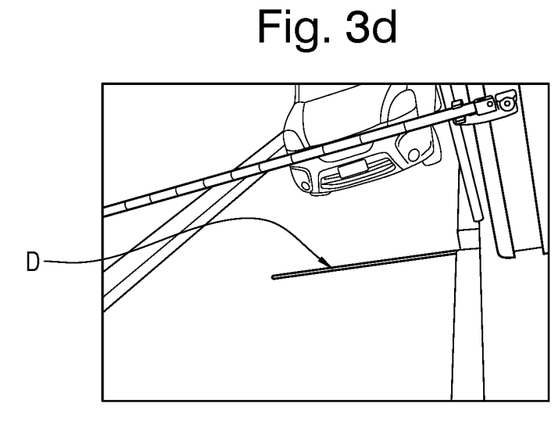

FIGS. 3C and 3D show photographs of the arrangement of the present invention embedded in the pavement.

Figure 4:
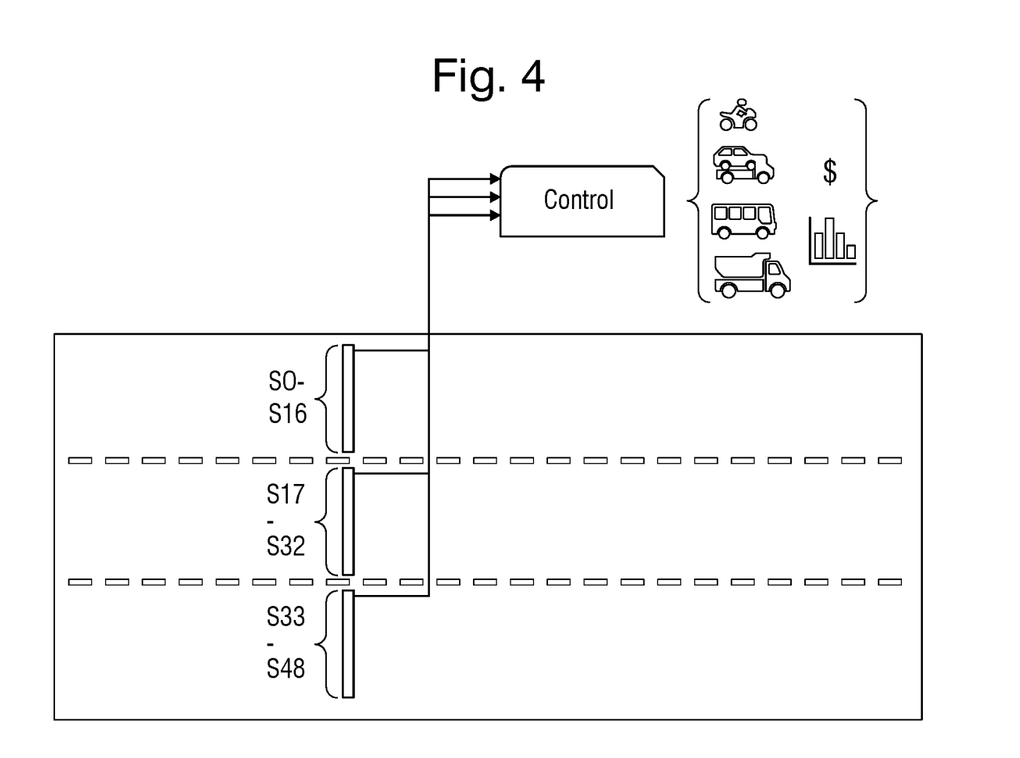
FIG. 4 presents a known arrangement suitable for being used on multiple lanes.

A known arrangement suitable for use on multiple lanes is shown in FIG. 4, wherein one is installed per lane and connected to the control. Each wheel sensor is made up of 8 and up to 16 detection units, numbered in such a way that the interconnection of 3 lanes is configured from one end to the other as indicated in the figure, from S1 to S48, determining the position of the vehicle, although it circulates activating sensors of contiguous lanes. The technology applied to this sensor allows counting only radial wheels, whose tread is metallic.

BRIEF DESCRIPTION OF THE INVENTION

In view of the state-of-the-art documents, it is evident that a vehicle classification system is required for traffic statistics on roads, highways and for the collection of tolls at stations and multi-lane systems of free flow based on the use of Hall effect detectors and magnets with a strong magnetic field to detect the passage of a radial tire wheel (that is, having a metal mesh).

The proposed invention provides a solution to the detection of axles (wheels) in single or multiple lanes, at low and high speed, detecting single and dual axles in the same equipment.

All its elements are contained in a frame that, in a preferred implementation, is 25 mm wide×25 mm deep× 1600-2400 mm long, which is embedded in the pavement and is adhered with epoxy sealer, being flush with the surface.

SUMMARY OF THE INVENTION

A tire or tread detection device for the classification of vehicular traffic. The invention allows the detection of tires by identifying with certainty the number of axles that make up a vehicle, thus determining its traffic category or classification, for the determination of categories in toll collection and evaluation of road supply and demand. The invention is a development integrated by hardware and software, electronic control devices, signal analysis and communications. The device is made up of Hall Effect sensors for detecting the magnetic field and magnets with an intense magnetic field, geometrically arranged and interconnected to a microcomputer that interprets analog signals, to obtain the detection of the tire.

DETAILED DESCRIPTION OF THE INVENTION

The present invention is based on the detection of radial tires, that is, with metal treads, therefore, it is not suitable for detecting the passage of non-radial tires, that is, "biasply" tire with Nylon tread. However, the inventors have concluded that this does not pose any practical disadvantage since the use of non-radial or "biasply" tires with Nylon tread does not have a major impact on the tire market compared to radial wheels.

To justify this, a market research has been requested on the percentage of radial and non-radial or "biasply" tires in different countries of the world, wherein it is of interest to apply this technology, and in a document by the consulting firm Grand View Research®, the market penetration percentages for radial and biasply tires for various countries in the world can be seen. Table 1 shows the results for some countries of interest.

TABLE 1

| Country | Vehicle | % biasply | % radial |
|---|---|---|---|
| USA | For passengers | 0.0 | 100.0 |
|  | Light utility | 1.0 | 99.0 |
|  | Heavy utility | 2.0 | 98.0 |
|  | Two-wheeled | 9.5 | 90.5 |
| Mexico | For passengers | 2.0 | 98.0 |
|  | Light utility | 21.0 | 79.0 |
|  | Heavy utility | 30.0 | 70.0 |
|  | Two-wheeled | 24.0 | 76.0 |
| Great Britain | For passengers | 0.0 | 100.0 |
|  | Light utility | 2.5 | 97.5 |
|  | Heavy utility | 5.5 | 94.5 |
|  | Two-wheeled | 25.0 | 75.5 |
| Germany | For passengers | 0.0 | 100.0 |
|  | Light utility | 1.5 | 98.5 |
|  | Heavy utility | 5.0 | 95.0 |
|  | Two-wheeled | 20.0 | 80.0 |
| France | For passengers | 0.0 | 100.0 |
|  | Light utility | 6.0 | 94.0 |
|  | Heavy utility | 67.0 | 33.0 |
|  | Two-wheeled | 22.0 | 78.0 |
| Italy | For passengers | 0.0 | 100.0 |
|  | Light utility | 2.5 | 97.5 |
|  | Heavy utility | 5.0 | 95.0 |
|  | Two-wheeled | 8.0 | 92.0 |
| Spain | For passengers | 0.0 | 100.0 |
|  | Light utility | 3.0 | 97.0 |
|  | Heavy utility | 6.0 | 94.0 |
|  | Two-wheeled | 12.0 | 88.0 |
| China | For passengers | 0.0 | 100.0 |
|  | Light utility | 4.0 | 96.0 |
|  | Heavy utility | 5.0 | 95.0 |
|  | Two-wheeled | 28.0 | 72.0 |

TABLE 1-continued

| Country | Vehicle | % biasply | % radial |
|---|---|---|---|
| Japan | For passengers | 0.0 | 100.0 |
|  | Light utility | 4.0 | 96.0 |
|  | Heavy utility | 6.0 | 94.0 |
|  | Two-wheeled | 20.0 | 80.0 |
| Brazil | For passengers | 1.0 | 99.0 |
|  | Light utility | 40.0 | 60.0 |
|  | Heavy utility | 65.0 | 35.0 |
|  | Two-wheeled | 25.0 | 75.0 |
| Argentina | For passengers | 4.0 | 96.0 |
|  | Light utility | 45.0 | 55.0 |
|  | Heavy utility | 67.0 | 33.0 |
|  | Two-wheeled | 22.0 | 78.0 |
| Colombia | For passengers | 3.0 | 97.0 |
|  | Utility | 70.0 | 30.0 |
|  | Two-wheeled | 24.0 | 76.0 |
| Chile | For passengers | 5.0 | 95.0 |
|  | Utility | 68.0 | 32.0 |
|  | Two-wheeled | 27.0 | 73.0 |

The equipment of the present invention does not contain moving parts nor does it require pressure deformation to detect the wheel, thus extending its useful life. The invention is a development integrated by hardware and software, electronic control devices, signal analysis and communications.

Its technical object is the measurement by Hall sensors of the variation of a magnetic field caused by a magnet when approaching the metallic tread that radial tires have, for the measurement and classification of traffic as a wheel counter device.

The Hall Effect sensor uses the Hall Effect to measure magnetic fields or currents or to determine the position thereof. If current flows through a Hall sensor and approaches a magnetic field that flows in a vertical direction to the sensor, then the sensor creates an output voltage proportional to the product of the magnetic field strength and the current. If both the magnetic field strength and the current are known, then the Hall sensor can be used as a metal detector. As a position sensor or detector for magnetic components, Hall sensors are especially advantageous if the variation in the magnetic field is comparatively slow or zero. In these cases the inductor used as a sensor does not provide a relevant induction voltage.

The application of the invention is applied to traffic control, volume measurement, classification of categories for the toll collection at toll stations and free flow.

The device of the present invention is capable of detecting single and dual wheels (axles) in a single device, involving simple installation and having long useful life.

The material with which it is built has a resistance with characteristics similar to the pavement in which it is installed, without suffering deformations resulting from the pressure exerted by the tires on the sensor.

Embedded in rigid or flexible pavement using epoxy component sealants, the magnetic variation detection mechanism of the present invention allows wheels to be detected at high speed pitch.

The reduced size of the device of the present invention facilitates installation, in a small cut of few millimeters. In a preferred embodiment the volume occupied by the sensor device is 30 mm×30 mm, 30 mm×1500 mm, or 2400 mm in length, according to the application.

The device of the present invention works embedded in the pavement and leveled with it, it does not present edges that may cause impacts on the tires.

Its visibility after being installed is similar to a sealing of a pavement expansion joint, being imperceptible for circulation. See FIGS. 3B, 3C and 3D.

Figure 5:
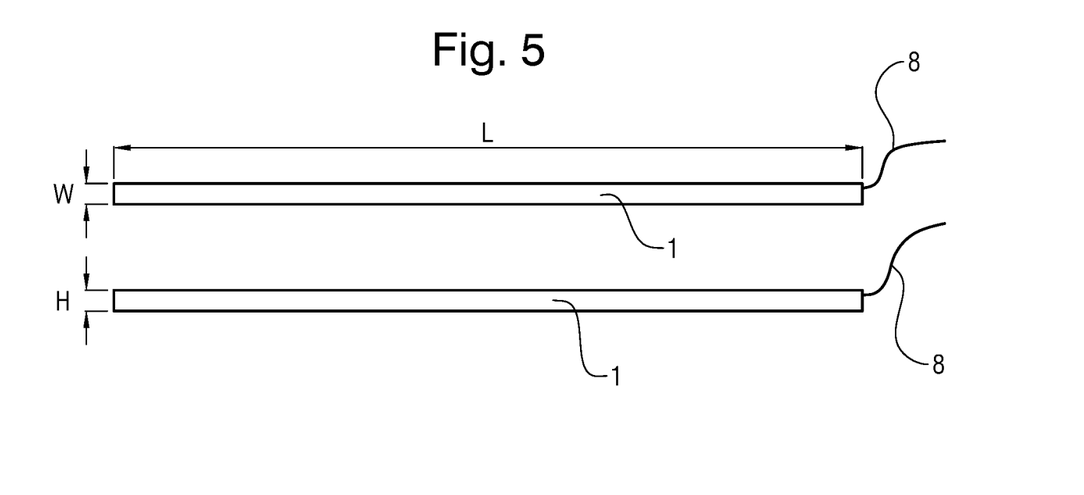
FIG. 5 shows a side view of the device of the present invention.

Construction details: FIG. 5 shows a side view of the sensor arrangement of the present invention and it is observed that it has a rectangular parallelepiped shape and it is observed the power, digital output and communication cable 8 connected at one of its ends. In a preferred embodiment, the cabinet 2 has the following measurements L=1500-2400 mm; W=25 mm; H=25 mm, but these measurements may vary according to the need of the installation (See FIGS. 7 and 8).

Figure 6:
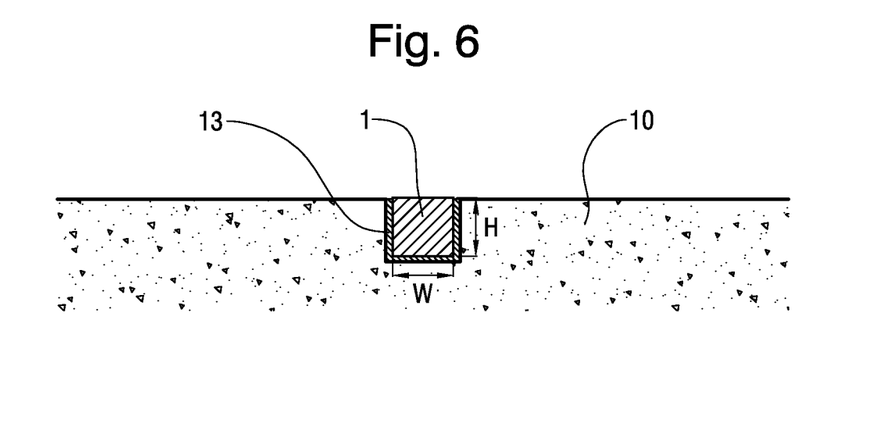
FIG. 6 shows a cross-sectional view of the sensor installation of the present invention.

In FIG. 6 it is observed that the sensing arrangement 1 is embedded and fixed inside the pavement 10 by means of an epoxy adhesive 13.

Figure 7:
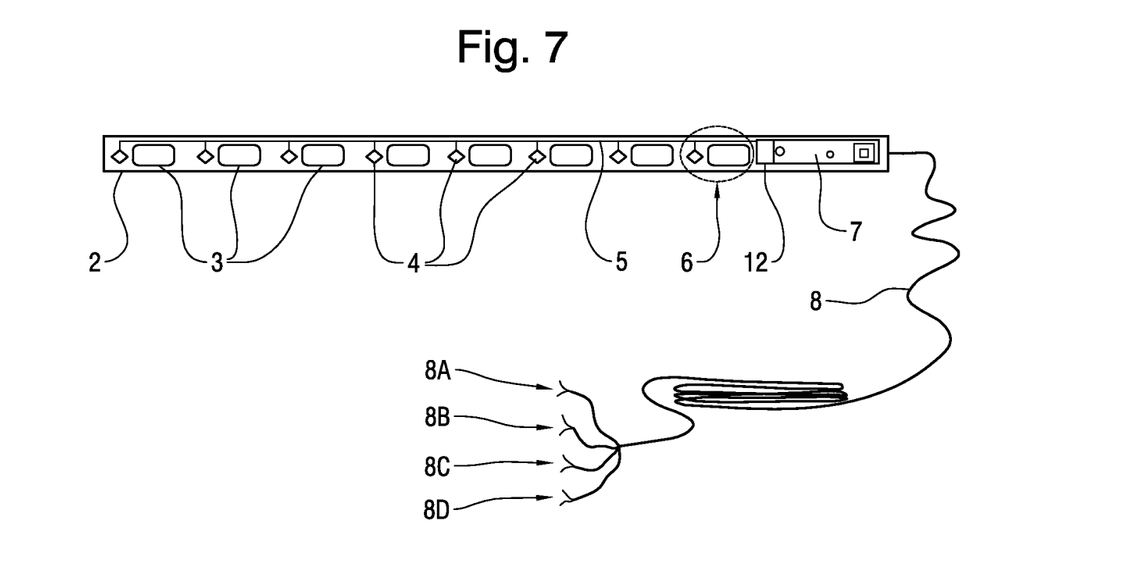
FIG. 7 shows a side cutaway view of the internal diagram of the sensor of the present invention.

FIG. 7 shows that the sensing arrangement is contained within a cabinet 2 which in a preferred embodiment may be made of "U" type aluminum and may be 1.5 mm thick. Inside the cabinet there is a line of magnets 3, geometrically arranged together with the unipolar Hall Effect sensors 4, connected to the analog bus 5, and this bus to the electronic signal conditioning interface 12 that is connected to the microcontroller 7; the entire system has communication, digital outputs and power supply via the multi-pair cable 8.

Each pair of sensor 4 and magnet 3 is a sensing unit 6, which are the basic elements for detecting the metallic tread of the tire. In a preferred implementation, the magnets 3 are of Neodymium N45 with dimensions 30×20×10 mm and the Hall effect sensors 4 make up the sensing units 6, which can vary from 8 to 16 units depending on the length sought. In a preferred implementation, the Hall Effect sensors are unipolar Hall Effect sensors, proportional to the magnetic field flow of the S pole, specially designed with precision for positioning and angular movement, with a very good sensitivity and dynamic range 200 mV/mT, 20-mT.

The preferred distance F between sensing units 6 is 150 mm, discriminating single wheels with the excitation of one or two sensing units 6, for tires from 120 mm to 240 mm and the excitation of 3 or more sensing units 6 for dual or wide wheel. See FIGS. 10 and 11.

Cable 8 is a multipair type of 4 pairs FTP (Foil Twisted Pair) Category 6, which can be up to 300 m in length, where each pair fulfills the function of: 8A: power supply of the arrangement with 12 $V_{DC}$, 8B: for communication, means for carrying data communication protocol EIA RS485/232 or USB output, 8C: ON/OFF opto-coupled output indicating single wheel detection, 8D: ON/OFF opto-coupled output indicating dual wheel detection. To provide opto-coupled outputs the device of the present invention comprises a pair of output opto-coupler transistors (not shown in the figures). For replacements of existing arrangements the outputs can be optionally connected to external relays to provide dry contacts.

Figure 8:
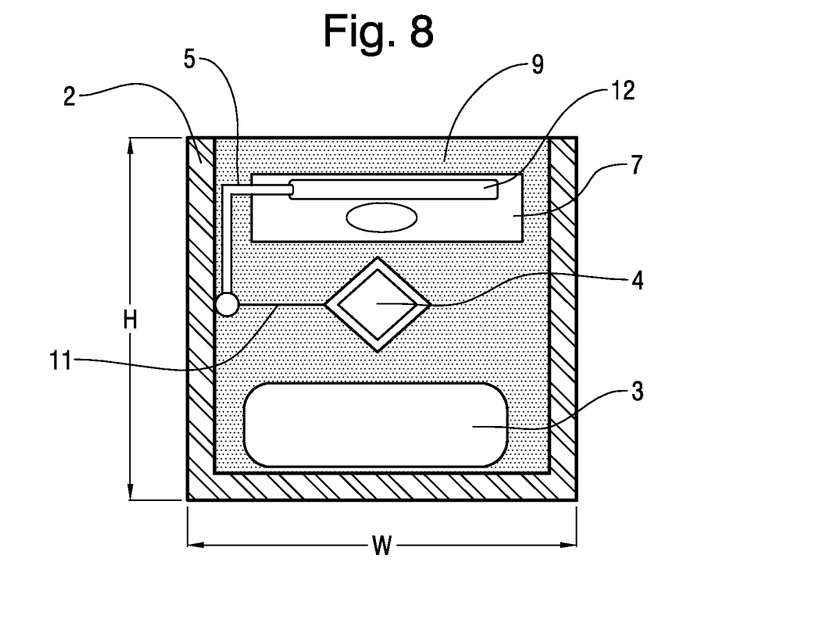
FIG. 8 shows a detailed cross-sectional view of the sensor of the present invention.

FIG. 8 shows a front cross section of the elements of the arrangement. The thickness of the cabinet 2 walls of approximately 1.5 mm is observed. The position of the magnet 3, the hall effect sensor 4, connected by 11 to the analog bus 5, which receives the signals from each Hall effect sensor 4, and interconnects to the interface 12 and is connected to the microcontroller 7; the entire set embedded in epoxy resin 9.

Figure 9:
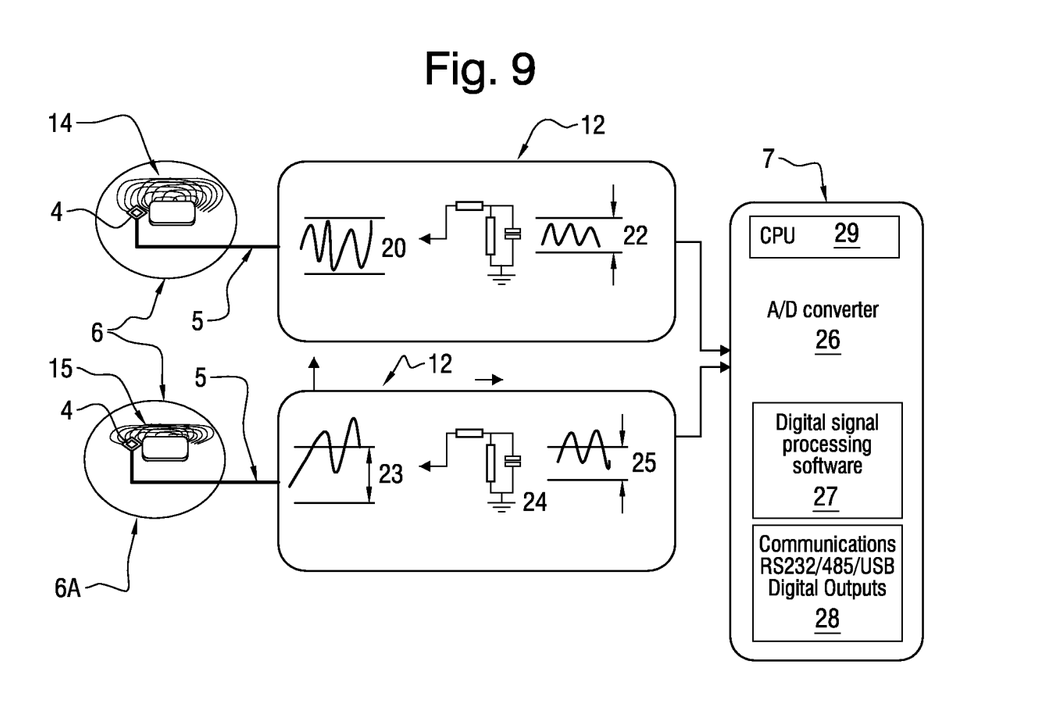
FIG. 9 shows a functional block diagram of the detection system of the present invention.

FIG. 9 shows two sensing units 6, each connected by 11 to the analog data bus 5, which carries the analog electrical signal from each sensing unit to signal conditioning interface 12, consisting of low-pass filters and level conditioners 21 and 24, with their outputs 22 and 25 connected to the inputs of the A/D converter 26 of the microcontroller 7.

The connectivity of the sensing arrangement 1 with the outside is through the multi-pair cable 8, according to the defined functions of each pair 8A-8B-8C-8D. Through the multipair cable 8, the signals generated by the arrangement are transmitted to a remote terminal (not shown in the figures) in which they are processed to allow full management of vehicle control. The remote terminal can be a tablet, a desktop PC or a dedicated terminal for receiving the data to re-transmit it wirelessly via wired internet, WIFI or GSM to process the data in a remote computer center.

The number of sensing units 6 can range from 8 to 16 modules, varying the length of the sensor from 1.50 m to 2.20 m. See FIG. 5.

All sensing unit modules 6, microcontroller 7 and their interconnections housed in containment cabinet 2, are embedded in epoxy resin 9, with optimal dielectric properties and mechanical resistance to traction and compression. See FIG. 3C.

The containment cabinet 2 of the arrangement is a "U" profile, preferably 1.5 mm thick and preferably with the measurements already mentioned above.

Operation

Figure 10:
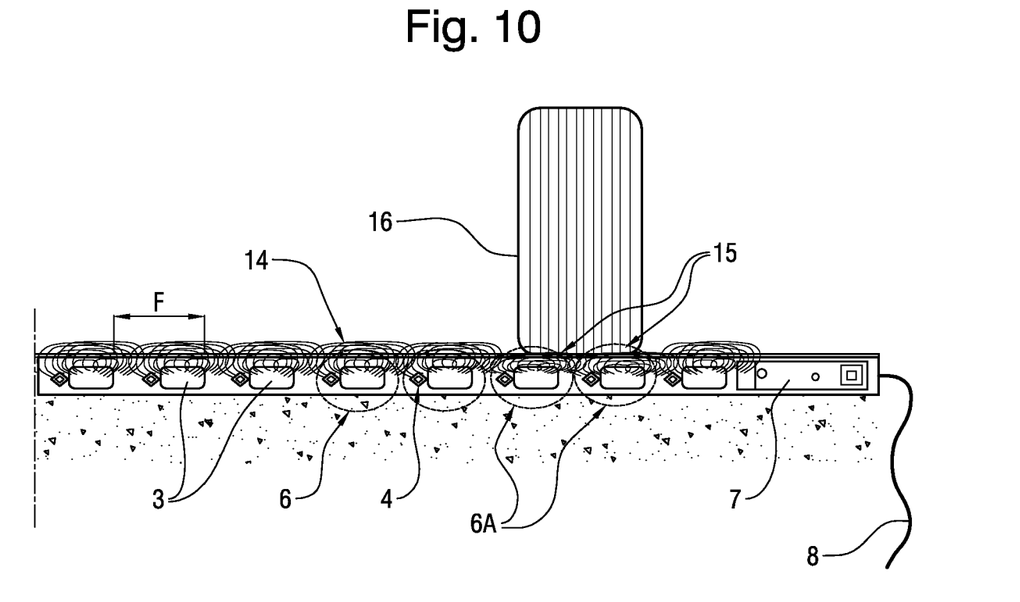
FIG. 10 presents the arrangement of the present invention detecting the passage of a single wheel.

FIG. 10 shows that the passage of a radial tire 16 over the sensing arrangement 1 modifies the distribution of the field lines and the intensity of the magnetic field 15, which closes the magnetic circuit through the metal mesh of the tire, generating variations in the sensing units 6A involved.

In this FIG. 10 it is observed that, when there is no presence of radial tire 16 on the sensing arrangement 1, the sensing units 6 detect constant magnetic field lines 14, remaining in an idle or non-detection state.

FIG. 9 shows a detail of both operating conditions 14 and 15. For the case of idle state 14 the sensing unit 6 remains constant, but the analog signal of the Hall sensor 4 has voltage variations that range between maximum and minimum or off-set values 20 of the system, without exceeding the parameters set as the detection threshold.

The case 15, in the presence of a radial tire, the sensing unit 6, generates variations in the Hall sensor 4, higher than the voltage values set as parameters, producing a detection 23.

FIG. 9 shows how these variations 20 and 23 enter the analog signal conditioning electronic interface 12. This interface is made up of 8 or up to 16 passive filters, low passes, level conditioners 21-24, one for each sensing unit 6 of the sensing arrangement 1. The outputs of these filters 22-25 are connected to the inputs of the A/D converter 26 of the microcontroller 7.

The inputs of the A/D converter 26 of the microcontroller 7 read the conditioned analog signals 22-25 and the CPU 29 executes the digital conversion process through the digital signal processing software 27 resident in the microcontroller 7.

The result of the digital signal processing 27 shall indicate which of the sensing unit or units 6 has been activated, executing a software procedure that activates the software protocol, which sends the position data of the sensing unit or units 6 and the number of sensing units 6 being activated, by means of 28 to 8B, on an EIA RS485/232 protocol or USB output, thus communicating the position of the tread of the wheel, single wheels and double wheels (width).

The 2 potential-free ON/OFF contact outputs 8C and 8D (FIG. 7) are useful because they allow the arrangement of the present invention to be used as a direct replacement for existing contact (switch)—type systems, piezoelectric sensor, pneumatic sensor, fiber optic, etc. For example, FIG. 2 shows in an equipment of the prior art, the use of 3 axle counters each with on/off contact (switch) outputs that can be converted, by replacement by the equipment of the present invention, into a single counter (See FIG. 3), receiving the same contact (switch) type signals from this equipment.

The advantage of having various output signal protocols is that it allows integration into control systems developed by third parties, taking into account that this equipment is part of vehicle traffic and toll management systems.

Figure 11:
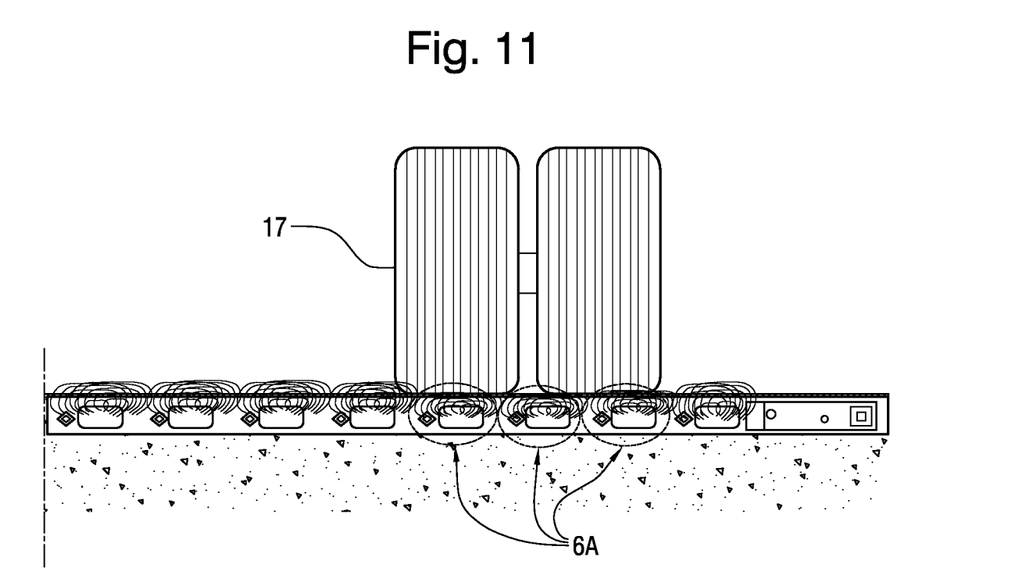
FIG. 11 shows/presents the arrangement of the present invention detecting the passage of a double wheel.

FIG. 11 shows the activation of the sensing units 6A by the tread of dual wheels 17.

Figure 12:
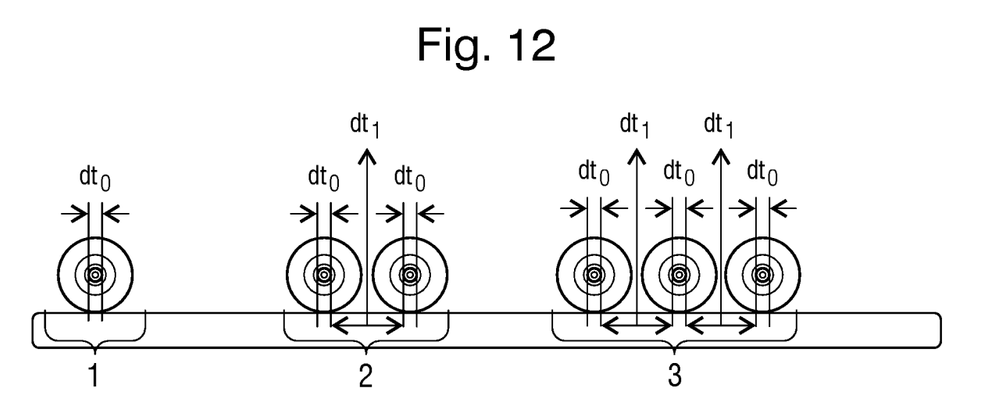
FIG. 12 shows the method of detecting tandem, tridem axle train formations.

FIG. 12 shows the single axle 1, tandem 2, tridem 3 axle formations and the time differentials $dt_0$ of one wheel and $dt_1$ between wheels.

Figure 13:
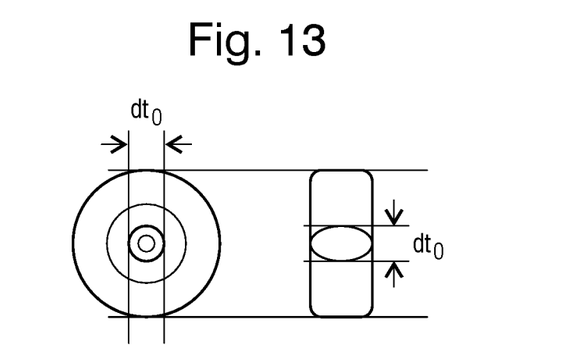
FIG. 13 shows in detail the operation for the detection of axle train formations.

In FIG. 13 the differential $dt_0$ shows the time that the patch or tread of the vehicle remains on the sensor, this time $dt_0$ is the one that elapses between the beginning and the end of the tread of the wheel and is calculated by the microcontroller 7 to determine how many units $dt_0$ the next axle is.

This unit $dt_0$ is multiplied by a factor K=1, 2, 3, . . . 6, $K*dt_0=dt_1$, (FIG. 12), determining $dt_1$ as the time in which a new axle is expected, if this detection occurs within the range $dt_1$, the formation is configured as a tandem axle, if another axle is received again within the time $dt_1$, a tridem axle is formed.

In this way, different formations are configured according to their axle configuration.

Having thus specially described and determined the nature of the present invention and the way in which it is to be put into practice, it is stated that the following is claimed as property and exclusive right:

1. A tread or tire detection arrangement (1) for the classification of vehicular traffic, comprising: a cabinet (2) that houses a plurality of sensing units (6); characterized in that each one of the sensing units (6) is formed by a permanent magnet (3) and a Hall effect sensor (4), wherein in each sensing unit, said magnet (3) creates a magnetic field that flows in a vertical direction to the Hall effect sensor, a change in the strength of the magnetic field due to the presence of a tire is detected by the Hall effect sensor, and the Hall effect sensor (4) creates an output voltage proportional to the change in the magnetic field strength;

the arrangement further comprising a multi-pair cable (8), wherein a first pair (8A) of the multi-pair cable (8) supplies the sensing units (6), a conditioning unit (12) and a microcontroller (7) with a supply voltage, a second pair (8B) communicates data to and from a remote terminal by EIA RS485/232 or USB protocol; a third pair (8C) works as an ON/OFF output for indication of the presence of a single wheel and a fourth pair (8D) works as an ON/OFF output for an indication of the presence of a double wheel.

2. The arrangement according to claim 1, wherein each of said Hall effect sensors (4) are connected to an analog bus (5) that transmits the signals emitted by each sensor (4) to a signal conditioning interface (12) that injects the conditioned signals to a microcontroller (7); said interface (12) and said microcontroller (7) also being contained within the cabinet (6); and a multi-pair cable (8) that electrically feeds the arrangement (1) and transmits the signals generated by the microcontroller (7) to a remote processing terminal.

3. The arrangement according to claim 2, wherein all the elements (3; 4; 5; 7; 12) contained within the cabinet (2) are embedded in epoxy resin (9).

4. The arrangement according to claim 2, wherein the cabinet houses 8 to 16 sensing units (6).

5. The arrangement according to claim 2, wherein the cabinet has a length that varies from 1.50 m to 2.20 m.

6. The arrangement according to claim 2, wherein the magnets (3) are made of Neodymium N45.

7. The arrangement according to claim 2, wherein the magnets (3) have sizes 30×20×10 mm.

8. The arrangement according to claim 2, wherein said cabinet (2) is made of aluminum, has a thickness of 1.5 mm.

9. The arrangement according to claim 2, wherein said cabinet (2) measures 1500 to 2400 mm long, 25 mm wide and 25 mm high.

10. The arrangement according to claim 2, wherein the sensing units are located inside the cabinet with a separation of 150 mm from each other.

11. The arrangement according to claim 2, wherein it comprises two opto-coupler transistors to generate opto-coupled ON/OFF outputs.

12. The arrangement according to claim 11, wherein the multipair cable (8) is 4 pairs of the FTP (Foil Twisted Pair) type Category 6.

13. The arrangement according to claim 1, wherein each of the third (8C) and fourth (8D) pairs connect to an opto-coupled output.

14. The arrangement according to claim 1, wherein each of the third (8C) and fourth (D) pairs are connected to an intermediate micro-relay to provide dry contact signal.

15. The arrangement according to claim 1, wherein the supply voltage is 12 Voe.

16. The arrangement according to claim 2, wherein said conditioning interface (12) comprises low-pass filters and level conditioners (21; 24).

17. The arrangement according to claim 2, wherein microcontroller comprises an A/D converter (26) that converts analog signals to digital signals and a CPU (29) that processes the signals received from said A/D converter (26) by means of resident digital processing software (27).

18. The arrangement according to claim 2, wherein in the absence of a radial tire (16) on the sensing arrangement (1), the sensing units (6) detect constant magnetic field lines (14), whereby the output signal in the signal pairs (8B; 8C, 8D) of the multipair cable (8) is null; and with the presence of a radial tire (16) on the sensing arrangement (1), the sensing units (6) detect variations in the magnetic field (15) whereby the output signal in the signal pairs (8B; 8C; 8D) of the multipair cable (8) is an activating one.

19. The arrangement according to claim 2, wherein microcontroller calculates the time that the vehicle's patch or tread remains on the sensor (dt0), 7 to determine how many dt0 units the next axis is located, and this dt0 unit is multiplied by a factor K=1, 2, 3, . . . 6, K*dt0 to obtain the time in which a new axis is expected (dt1) and, if this detection occurs within the dt1 interval, the formation is configured as a tandem axle; if another axis is received again within the time dt1, a tridem axle is formed; with which different formations are configured according to their axle configuration.

20. The arrangement according to claim 2, wherein the multipair cable (8) transmits the signals generated by the arrangement to a remote terminal wherein they are processed to allow management of vehicle control.

21. The arrangement according to claim 2, wherein said remote terminal is a tablet, a desktop PC or a dedicated terminal for receiving data.

22. The arrangement according to claim 2, wherein said terminal re-transmits the data wirelessly via wired internet, WIFI or GSM to process the data in a remote computer center.

* * * * *